(12) United States Patent
Luzi

(10) Patent No.: US 10,833,659 B2
(45) Date of Patent: Nov. 10, 2020

(54) VOLTAGE SAMPLING CIRCUITS

(71) Applicant: Nordic Semiconductor ASA, Trondheim (NO)

(72) Inventor: Werner Luzi, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/472,586

(22) PCT Filed: Dec. 20, 2017

(86) PCT No.: PCT/GB2017/053832
§ 371 (c)(1),
(2) Date: Jun. 21, 2019

(87) PCT Pub. No.: WO2018/115864
PCT Pub. Date: Jun. 28, 2018

(65) Prior Publication Data
US 2019/0326890 A1    Oct. 24, 2019

(30) Foreign Application Priority Data

Dec. 22, 2016   (GB) .................................. 1622029.5

(51) Int. Cl.
*H03K 3/03*       (2006.01)
*G11C 27/02*     (2006.01)
(Continued)

(52) U.S. Cl.
CPC ............. *H03K 3/0315* (2013.01); *G11C 7/04* (2013.01); *G11C 27/02* (2013.01); *G11C 27/024* (2013.01);
(Continued)

(58) Field of Classification Search
CPC .. H03K 3/0315; H03K 3/011; G01R 31/2621; G11C 11/406; G11C 11/40626;
(Continued)

(56) References Cited

U.S. PATENT DOCUMENTS

| 5,410,278 A | 4/1995 | Itoh et al. |
| 5,952,892 A | 9/1999 | Szajda |

(Continued)

FOREIGN PATENT DOCUMENTS

| EP | 1 657 615 A2 | 5/2006 |
| JP | 2016-116053 A | 6/2016 |

(Continued)

OTHER PUBLICATIONS

Combined Search and Examination Report under Sections 17 & 18(3) for GB1721493.3, dated Jun. 18, 2018, 20 pages.
(Continued)

*Primary Examiner* — Ryan Johnson
(74) *Attorney, Agent, or Firm* — Klarquist Sparkman, LLP

(57) ABSTRACT

A voltage sampling circuit arrangement comprises: an oscillator circuit portion arranged to produce a periodic oscillator output signal at an oscillation frequency dependent on a bias current provided thereto; a sampling circuit portion arranged selectively to connect an input terminal ($V_{in}$) to an output terminal ($V_{out}$) in response to an applied switching signal ($V_{switch}$) derived from said oscillator output signal, wherein said sampling circuit portion has a current leakage dependent on temperature; and a biasing circuit portion arranged to provide said bias current to the oscillator circuit portion wherein said bias current is dependent on temperature.

14 Claims, 3 Drawing Sheets

(51) Int. Cl.
*G11C 7/04* (2006.01)
*G01R 31/26* (2020.01)
*G11C 11/406* (2006.01)

(52) U.S. Cl.
CPC .... *G01R 31/2621* (2013.01); *G11C 11/40626* (2013.01)

(58) Field of Classification Search
CPC ..... G11C 27/02; G11C 27/024; G11C 27/026; G11C 7/04
See application file for complete search history.

(56) References Cited

U.S. PATENT DOCUMENTS

| | | | |
|---|---|---|---|
| 6,166,766 A | 12/2000 | Moore et al. | |
| 8,427,245 B2 * | 4/2013 | Sandhu | H03K 3/0315 331/57 |
| 9,041,407 B2 * | 5/2015 | Terada | G01R 31/2621 324/509 |
| 9,325,323 B2 * | 4/2016 | Rana | H03K 3/0315 |
| 2002/0018387 A1 | 2/2002 | Nam et al. | |
| 2006/0012391 A1 | 1/2006 | Huang | |
| 2009/0051331 A1 | 2/2009 | Gerber et al. | |
| 2011/0057736 A1 | 3/2011 | Badillo | |
| 2014/0132240 A1 | 5/2014 | McQuirk et al. | |
| 2015/0155053 A1 | 6/2015 | Gailhard et al. | |

FOREIGN PATENT DOCUMENTS

| | | |
|---|---|---|
| WO | WO 2004/008639 A2 | 1/2004 |
| WO | WO 2009/004074 A1 | 1/2009 |

OTHER PUBLICATIONS

International Search Report and Written Opinion for PCT/GB2017/053832, dated Mar. 24, 2018, 16 pages.
Search Report under Section 17(5) for GB1622029.5, dated May 22, 2017, 7 pages.

* cited by examiner

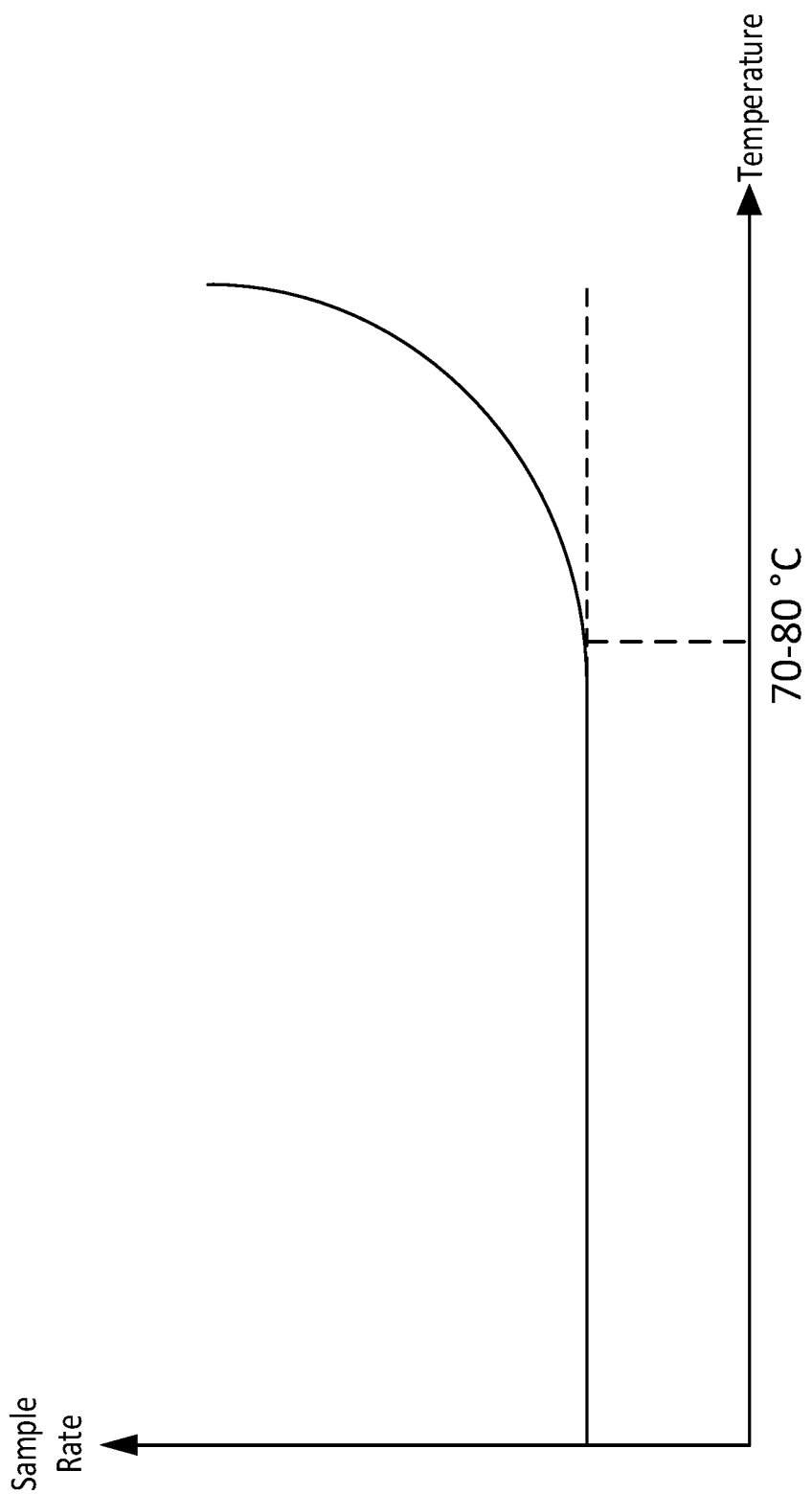

VOLTAGE SAMPLING CIRCUITS

CROSS REFERENCE TO RELATED APPLICATIONS

This is the U.S. National Stage of International Application No. PCT/GB2017/053832 filed Dec. 20, 2017, which was published in English under PCT Article 21(2), which in turn claims the benefit of Great Britain Application No. 1622029.5, filed Dec. 22, 2016.

The present invention relates to voltage sampling circuits, particularly to voltage sampling circuits that sample an input voltage periodically using a control signal from an oscillator.

The periodic enabling of a field-effect-transistor (FET) may be particularly useful in "sample-and-hold" circuits, where a value of a particular voltage is sampled intermittently and the sampled value stored—e.g. using a capacitor or a capacitive voltage divider—until the next sample is taken. In practice leakage currents through components such as the capacitor(s) and the FET itself cause the stored voltage to drop away or "droop" and hence it is necessary to take another sample periodically to counter this. The droop in the output voltage can be maintained below a desired level by setting the frequency at which samples are taken to be regular enough to prevent excessive droop. In other words, as the maximum voltage droop is a function of the sample frequency, the latter can be chosen to meet the design specification requirements of the former.

The Applicant has appreciated however that one of the limitations of this arrangement is that there the resultant circuit has a limited operating window for temperature since typically above a certain point, the leakage current of components such as the FET mentioned above will rise dramatically and give unacceptable voltage droop.

When viewed from a first aspect, the present invention provides a voltage sampling circuit arrangement comprising:
  an oscillator circuit portion arranged to produce a periodic oscillator output signal at an oscillation frequency dependent on a bias current provided thereto;
  a sampling circuit portion arranged selectively to connect an input terminal to an output terminal in response to an applied switching signal derived from said oscillator output signal, wherein said sampling circuit portion has a current leakage dependent on temperature;
  a biasing circuit portion arranged to provide said bias current to the oscillator circuit portion wherein said bias current is dependent on temperature.

Thus it will be appreciated by those skilled in the art that embodiments of the present invention provide an improved voltage sampling circuit arrangement wherein additional bias current may be supplied to the oscillator in order to increase the frequency of the oscillator output signal (and thus the switching signal) in response to an increase in temperature which gives rise to an increase in leakage current from the sampling circuit portion. For example if the temperature increases enough to increase the leakage current through the sampling circuit portion significantly, the frequency of the oscillator's output is increased so as to compensate for the increased rate at which the voltage at the output terminal of the sampling circuit portion droops due to the increased leakage current. This may therefore offset or preferably compensate for the increased droop and may therefore allow the droop to be maintained within design limits even as the operating temperature is increased. This may therefore allow the design operating temperature range to be increased.

The biasing circuit portion preferably has the same dependence on temperature as the sampling circuit portion leakage over at least a particular temperature range. At a minimum this implies that they should have the same sense or sign (positive or negative). For example if, as is typical, the sampling circuit portion leakage current increases with temperature, the biasing current should also increase with temperature. More preferably the two dependencies should have the same shape. For example, if one is a linear, exponential etc. dependency, so should the other be.

In some embodiments, the sampling circuit portion comprises a sampling transistor, wherein the sampling transistor is preferably a field-effect-transistor (FET) and more preferably a metal-oxide-semiconductor field-effect-transistor (MOSFET). In some such embodiments, the sampling transistor comprises an n-channel metal-oxide-semiconductor field-effect-transistor (nMOSFET), wherein the switching signal is applied to the gate terminal of the sampling transistor. In an alternative set of such embodiments, the sampling transistor comprises a p-channel metal-oxide-semiconductor field-effect-transistor (pMOSFET), wherein an inverted version of the switching signal is applied to the gate terminal of the sampling transistor, wherein said inverted version of the switching signal is produced by a further Boolean inverter connected between the pulse generator and the sampling transistor.

In a potentially overlapping set of embodiments, the biasing circuit portion comprises a leakage transistor. This leakage transistor is preferably "matched" to the sampling transistor described above. The term matched as used herein means that the leakage transistor and the sampling transistor are both of the same type (e.g. nMOSFET or preferably pMOSFET) and have similar leakage characteristics such that when a leakage current flows through the sampling transistor, a similar current will flow through the leakage transistor at the same time. This current through the leakage transistor can thus be used to provide the additional bias current to the oscillator circuit portion. This also advantageously helps to ensure that process variations in the sampling transistor are "tracked" by the leakage transistor. It will of course be appreciated that the advantages provided by the present invention may still be achieved even if the sampling and leakage transistors are not matched to one another.

The oscillator circuit portion could comprise a relaxation oscillator (sometimes called a non-linear oscillator). A relaxation oscillator uses an energy storing component (such as a capacitor) together with a non-linear switching device (such as a latch or a Schmitt trigger) connected in a feedback loop such that the switching device periodically charges and discharges the energy stored in the energy storing component.

It will be appreciated that the oscillator output signal and thus the switching signal will typically be subject to some degree of "jitter", wherein there is a slight random offset between the theoretical switching time and the actual switching time of the oscillator output signal between its logic low and logic high states. As such, the term "periodic" as used herein with reference to the oscillator output signal and the switching signal will be understood to mean that the signals are substantially periodic but includes signals that are subject to a finite amount of jitter within an acceptable tolerance, for example a variation in period of less than 10%, preferably less than 8%, more preferably less than 5% and more preferably less than 1%.

In a set of embodiments, the oscillator circuit portion comprises a ring oscillator circuit portion. In a set of such embodiments, the ring oscillator circuit portion comprises an odd number of Boolean inverters arranged in a closed ring such that each inverter has a respective output terminal thereof connected to an input terminal of another one of the inverters, wherein the oscillator output signal is output via a node connected to an output terminal of one of the inverters. As each inverter will set its output to the logical negation of the value at its input (i.e. if the input of a given inverter is logic high, its output will be logic high and vice versa), the ring having an odd number of inverters gives rise to oscillatory behaviour.

By way of simple example, in a ring of three inverters "A", "B", and "C", if the input to A is logic high, the output of A and thus the input of B is logic low. If the input of B is logic low, the output of B and thus the input of C is logic high. However, if the input of C is logic high, the output of C is logic low which sets the input of A to logic low rather than logic high as it was at the beginning of this example. Due to the finite propagation delay introduced by each inverter, a periodic oscillation between the logic high and logic low states at the output of each inverter may be observed and may be taken as an output from the ring oscillator. It will be appreciated that with a circular chain of an even number of inverters, this behaviour does not occur as the output of the "last" inverter in the chain is the same as the starting input value of the "first" inverter and the chain settles in a particular state. However, more complex ring oscillator topologies or alternative ring oscillator constructions are envisaged and should be understood to fall within the scope of the claimed invention.

The frequency of the output signal produced by a ring oscillator is typically dependent on the voltage applied to the ring oscillator and the number of inverters in the ring. The frequency of a ring oscillator can also be controlled by using it in a "current starved" mode. In a current starved ring oscillator, the inverters are not connected directly to the supply voltage rails (e.g. $V_{DD}$ and ground) but are instead placed in series with a biasing transistor. By controlling the amount of current that can be drawn by the inverter, the speed at which the inverter can pull its output signal up or down in response to a new value at its input is limited and thus the frequency of the output of the ring oscillator may be set accordingly.

The oscillator output signal produced by the oscillator circuit portion could be connected directly to the sampling circuit portion so as intermittently to connect the input and output terminals to one another such that the switching signal comprises the oscillator output signal. However, in a set of embodiments the sampling circuit portion further comprises a pulse generator arranged to receive the oscillator output signal from the oscillator circuit portion and produce the switching signal therefrom. The switching signal may therefore comprise an impulse train. The term "impulse train" as used herein refers to a periodic signal constructed from a series of relatively short impulses. An impulse train is also referred to in the art as a "sampling function" or a "Dirac comb" due to such signals typically being modelled mathematically as a series of Dirac delta functions.

In such embodiments, the oscillator circuit portion and the pulse generator may form a monostable or "one shot" multivibrator arrangement. A monostable multivibrator is a type of relaxation oscillator, known in the art per se, that is only stable in one logical state and if triggered into the other logical state by an external stimulus returns to the stable state. For example the output is only stable if it is logic high (or equivalently logic low) and, if forced into the logic low (or logic high where appropriate) state, will return to its stable state relatively quickly. In such embodiments, the pulse generator may be viewed as a one shot pulse generator that is triggered into its unstable logic state by the oscillator output signal, e.g. by an edge of the oscillator output signal such as a rising edge and/or a falling edge.

In a set of preferred embodiments, the biasing circuit portion comprises a current reference transistor and one or more current mirror transistors, wherein the current reference transistor and the one or more current mirror transistors are arranged such that respective gate terminals thereof are connected to a drain terminal of the current reference transistor. Thus in such embodiments, the current reference transistor is diode-connected and any current that flows therethrough is "mirrored" through the one or more current mirror transistors. The current reference transistor and the one or more current mirror transistors are preferably nMOSFETs. In preferred embodiments in which a ring oscillator is provided, there are the same number of current mirror transistors as inverters in the ring oscillator, such that each inverter is provided with a current mirror transistor. It will be appreciated that in alternative embodiments, the one or more current mirror transistors may instead be pMOSFETs and in such embodiments, the leakage transistor and in a set of such embodiments, the leakage and sampling transistors described previously may be nMOSFETs (i.e. the circuit arrangement is "flipped").

In a set of such embodiments, the drain terminal of the current reference transistor is further connected to a constant current source. In such embodiments, this constant current source provides the ring oscillator circuit portion with a constant current at all times regardless of any leakage current through the sampling circuit portion. The current produced by such a constant current source may be substantially independent of temperature.

While the biasing circuit portion may be arranged to provide a 'baseline' bias current separately from a fraction thereof which is dependent on temperature, in a set of embodiments the drain terminal of the current reference transistor is further connected to the leakage transistor. In accordance with such embodiments, the biasing circuit portion may "sum" the constant current provided by the constant current source and the additional bias current provided by the leakage transistor to produce the bias current that is provided to the oscillator circuit portion.

The summing of the constant current and the leakage current provides a minimum current to the current reference transistor, as only the leakage current is dependent on temperature (i.e. when the leakage current is zero). Therefore, there is a corresponding minimum oscillation frequency of the oscillator circuit portion. Thus, the frequency of oscillation of the oscillator circuit portion will only rise above the minimum oscillation frequency when the circuit is experiencing an elevated temperature. The applicant has realised that this may be important for many applications that require a minimum sampling frequency.

Where provided, the leakage transistor may be arranged such that a drain terminal thereof is connected to the drain terminal of the current reference transistor. The leakage transistor may comprise a pMOSFET, wherein the source and gate terminals are connected to the supply voltage (i.e. to $V_{DD}$).

An embodiment of the present invention will now be described with reference to the accompanying drawings in which:

FIG. 3 is a graph showing the effect of temperature on the sample rate used by the voltage sampling circuit of FIG. 1.

Figure 1:
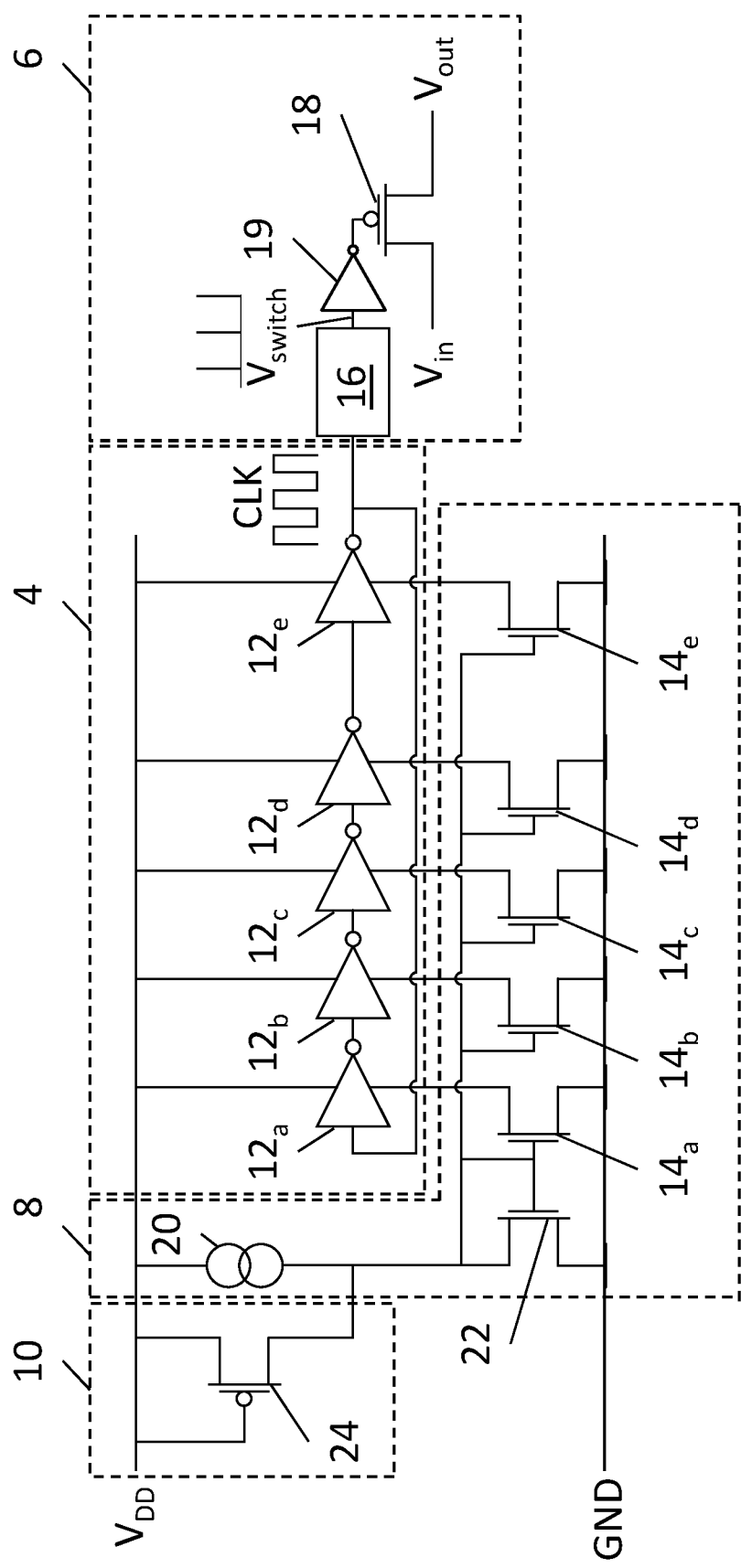
FIG. 1 is a circuit diagram of a voltage sampling circuit arrangement in accordance with an embodiment of the present invention.

FIG. 1 is a circuit diagram of a voltage sampling circuit arrangement 2 in accordance with an embodiment of the present invention. The voltage sampling circuit arrangement 2 comprises: a ring oscillator circuit portion 4; a sampling circuit portion 6; a baseline biasing circuit portion 8; and a leakage compensation bias circuit portion 10. It should be understood that the voltage sampling circuit arrangement 2 has been divided into these circuit portions 4, 6, 8, 10 for illustrative purposes only and the voltage sampling circuit arrangement 2 would typically be implemented as a single integrated circuit. The structure and function of each of these circuit portions 4, 6, 8, 10 will be described in further detail below.

The ring oscillator circuit portion 4 comprises five Boolean inverters 12a-e. While the ring oscillator circuit portion 4 shown in FIG. 1 comprises five inverters, it will be appreciated that the ring oscillator circuit portion 4 may comprise any odd number of inverters in practice. The inverters 12a-e are arranged topologically in a ring such that the output of each inverter is connected to the input of the next inverter in the ring. For example, the output of the "first" inverter 12a is connected to the input of the "second" inverter 12b, while the output of the second inverter 12b is connected to the input of the "third" inverter 12c. This "daisy chaining" continues in this manner and loops back such that the output of the "last" inverter 12e is connected back to the input of the first inverter 12a. Each of the inverters 12a-e is arranged such that its positive power terminal is connected to the supply voltage $V_{DD}$ while its negative power terminal is connected to ground GND via respective current mirror n-channel metal-oxide-semiconductor field-effect-transistors (nMOSFETs) 14a-e so as to "current starve" the ring oscillator circuit portion 4 and allow its frequency to be controlled as will be described in further detail below.

The sampling circuit portion 6 comprises a "one-shot" pulse generator 16 and a sampling p-channel metal-oxide-semiconductor field-effect-transistor (pMOSFET) 18. The input of the one-shot pulse generator 16 is connected to the output of the last inverter 12e in the ring oscillator circuit portion 4 (of course it could be connected to any of the inverters 12a-e). The output of the pulse generator 16 is connected to the gate terminal of the sampling pMOSFET 18 via a further inverter 19 (this sampling pMOSFET 18 and inverter 19 could equivalently be replaced with an nMOSFET). The source terminal of the sampling pMOSFET 18 is connected to an input voltage $V_{in}$ and the drain terminal of the sampling pMOSFET 18 is arranged to provide an output voltage $V_{out}$, wherein the sampled output voltage $V_{out}$ is a sampled version of the input voltage $V_{in}$ as will be described in further detail below.

The baseline biasing circuit portion 8 comprises: a constant current source 20; a current reference nMOSFET 22; and the current mirror nMOSFETs 14a-e. The baseline biasing circuit portion 8 is arranged such that the current reference nMOSFET 22 is diode-connected, i.e. its drain and gate terminals are connected together. The gate and drain terminals of the current reference nMOSFET 22 are further connected to the respective gate terminals of each of the current mirror nMOSFETs 14a-e and to the constant current source 20 which is connected to the supply voltage $V_{DD}$. The source terminals of each of the current mirror nMOSFETs 14a-e and the source terminal of the current reference nMOSFET 22 are connected to ground GND. The constant current source 20 provides a fixed bias current that is independent of temperature and flows through the diode-connected current reference nMOSFET 22. As the current reference nMOSFET 22 forms a current mirror with each of the current mirror nMOSFETs 14a-e, this fixed bias current also flows through each of the current mirror nMOSFETs 14a-e thus providing the inverters 12a-e with a constant bias current. Typically the magnitude of the current produced by the constant current source 20 is limited so as to "current starve" the ring oscillator circuit portion 4, i.e. each of the inverters 14a-e experiences a degree of difficulty in pulling its respective output up or down rapidly, and thus the magnitude of the fixed bias current may be used to set the frequency of the oscillator output signal CLK produced by the ring oscillator circuit portion 4.

The leakage compensation bias circuit portion 10 comprises a leakage pMOSFET 24 arranged such that its respective source and gate terminals are connected to the supply voltage $V_{DD}$ and its drain terminal is connected to the drain terminal of the current reference nMOSFET 22 and the gate terminals of the current reference nMOSFET 22 and current mirror nMOSFETs 14a-e. The leakage pMOSFET 24 is "matched" to the sampling pMOSFET 18 within the sampling circuit portion 6 such that they have similar leakage characteristics.

Figure 2:
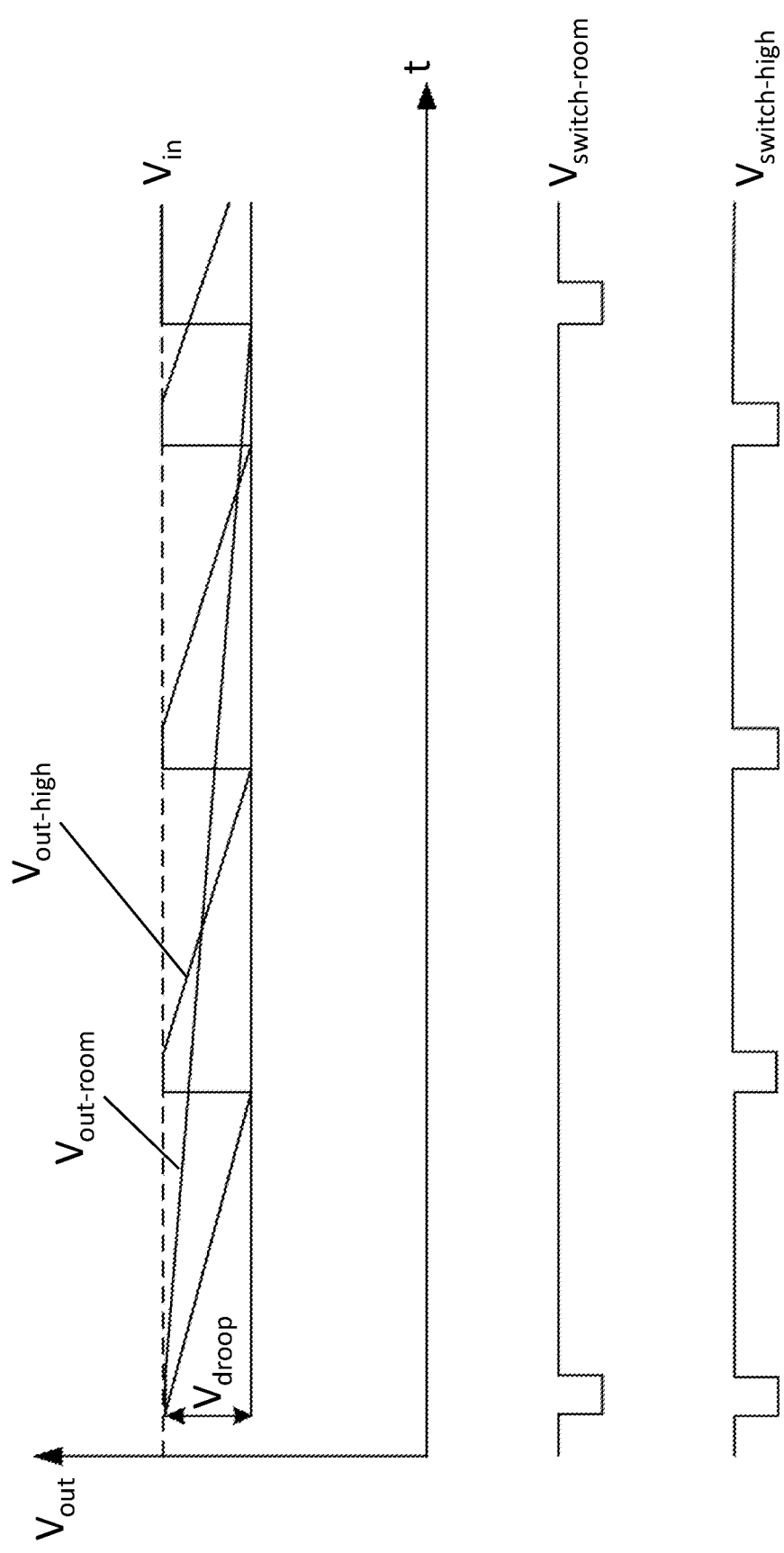
FIG. 2 is a graph showing the effect of temperature on the switching signal produced by the voltage sampling circuit of FIG. 1.

Operation of the circuit 2 of FIG. 1 will now be described with reference to FIG. 2 which is a graph showing the effect of temperature on the switching signal $V_{switch}$ produced by the pulse generator 16 within the voltage sampling circuit arrangement 2 of FIG. 1. The uppermost plot shows the value of the output voltage $V_{out}$ at room temperature $V_{out\text{-}room}$ and at an elevated temperature $V_{out\text{-}high}$ while the middle and lowermost plots show the switching signal at room temperature $V_{switch\text{-}room}$ and at an elevated temperature $V_{switch\text{-}high}$ respectively, wherein all three plots are shown as a function of time t.

When the switching pMOSFET 18 is disabled, the value of the output voltage $V_{out}$ "droops" from the value of the input voltage $V_{in}$ due to natural component leakage through the switching pMOSFET 18 and other components. As can be seen from FIG. 2, the value of the output voltage at an elevated temperature $V_{out\text{-}high}$ droops at an increased rate compared to the value of the output voltage at room temperature $V_{out\text{-}room}$. The increased rate of drooping at elevated temperatures is due to an increase in the temperature-dependent leakage current associated with the sampling pMOSFET 18. However, due to the leakage pMOSFET 24, additional current flows from the supply voltage rail through the leakage pMOSFET 24 and the current reference nMOSFET 22 and thus additional bias current is provided to the inverters 12a-e via the current mirror nMOSFETs 14a-e respectively.

As the leakage pMOSFET 24 is matched to the sampling pMOSFET 18, the additional bias current provided to the inverters 12a-e is proportional to the leakage current that flows through the sampling pMOSFET 18. This increase in bias current provided to the inverters 12a-e increases the frequency of the output signal CLK produced by the ring oscillator circuit portion 4 and thus the frequency of the switching signal $V_{switch}$ produced by the pulse generator 16. This causes the sampling pMOSFET 18 to be enabled more often and thus prevents $V_{out}$ from drooping by more than $V_{droop}$. The voltage sampling circuit arrangement 2 of FIG. 1 is arranged such that the output voltage $V_{out}$ does not droop by more than a threshold amount $V_{droop}$.

FIG. 3 is a graph showing the effective temperature on the sample rate (i.e. the frequency of the switching signal $V_{switch}$) used by the voltage sampling circuit arrangement 2 of FIG. 1. In this particular example, the sample rate is constant for low temperatures, e.g. up to approximately 70-80° C. After this critical temperature, the leakage current through the sampling pMOSFET 18 increases exponentially and thus so does the sample rate as described previously.

Thus it will be appreciated by those skilled in the art that embodiments of the present invention provide an improved voltage sampling circuit arrangement that may use low sample rates at low temperatures to minimise power consumption but can increase the sample rate in high temperatures in order to maintain the voltage droop associated with the output voltage below a desired amount. It will be appreciated by those skilled in the art that the embodiments described above are merely exemplary and are not limiting on the scope of the invention.

The invention claimed is:

1. A voltage sampling circuit arrangement comprising:
   an oscillator circuit portion arranged to produce a periodic oscillator output signal at an oscillation frequency dependent on a bias current provided thereto;
   a sampling circuit portion arranged selectively to connect an input terminal to an output terminal in response to an applied switching signal derived from said oscillator output signal, wherein said sampling circuit portion comprises a sampling transistor which has a current leakage dependent on temperature; and
   a biasing circuit portion arranged to provide said bias current to the oscillator circuit portion wherein said bias current is dependent on temperature and wherein said biasing circuit portion comprises;
   a leakage transistor matched to the sampling transistor such that when a leakage current flows through the sampling transistor, a similar current will flow through the leakage transistor; and
   a constant current source arranged to provide a constant current that is substantially independent of temperature; wherein
   the biasing circuit portion is arranged to sum the constant current provided by the constant current source with the additional bias current provided by the leakage transistor, such that the frequency of the oscillator circuit portion will only rise above a minimum oscillation frequency when the circuit is experiencing an elevated temperature.

2. The voltage sampling circuit arrangement as claimed in claim 1, wherein the biasing circuit portion has the same dependence on temperature as the sampling circuit portion leakage over at least a particular temperature range.

3. The voltage sampling circuit arrangement as claimed in claim 1, wherein the temperature dependencies of the biasing circuit portion and the sampling circuit portion leakage have the same shape.

4. The voltage sampling circuit arrangement as claimed in claim 1, wherein the sampling transistor is a field-effect-transistor.

5. The voltage sampling circuit arrangement as claimed in claim 4, wherein the sampling transistor is a metal-oxide-semiconductor field-effect-transistor.

6. The voltage sampling circuit arrangement as claimed in claim 5, wherein the sampling transistor is an n-channel metal-oxide-semiconductor field-effect-transistor arranged such that the switching signal is applied to the gate terminal of the sampling transistor.

7. The voltage sampling circuit arrangement as claimed in claim 5, wherein the sampling transistor comprises a p-channel metal-oxide-semiconductor field-effect-transistor arranged such that an inverted version of the switching signal is applied to the gate terminal of the sampling transistor, and wherein said inverted version of the switching signal is produced by a further Boolean inverter connected between the pulse generator and the sampling transistor.

8. The voltage sampling circuit arrangement as claimed in claim 1, wherein the oscillator circuit portion comprises a ring oscillator circuit portion.

9. The voltage sampling circuit arrangement as claimed in claim 8, wherein the ring oscillator circuit portion comprises an odd number of Boolean inverters arranged in a closed ring such that each inverter has a respective output terminal thereof connected to an input terminal of another one of the inverters, wherein the oscillator output signal is output via a node connected to an output terminal of one of the inverters.

10. The voltage sampling circuit arrangement as claimed in claim 8, wherein the biasing circuit portion comprises a current reference transistor and one or more current mirror transistors, wherein the current reference transistor and the one or more current mirror transistors are arranged such that respective gate terminals thereof are connected to a drain terminal of the current reference transistor.

11. The voltage sampling circuit arrangement as claimed in claim 10, comprising the same number of current mirror transistors as inverters in the ring oscillator, such that each inverter is provided with a current mirror transistor.

12. The voltage sampling circuit arrangement as claimed in claim 10, wherein the current reference transistor and the one or more current mirror transistors are n-channel metal-oxide-semiconductor field-effect-transistors.

13. The voltage sampling circuit arrangement as claimed in claim 10, wherein the drain terminal of the current reference transistor is further connected to the constant current source.

14. The voltage sampling circuit arrangement as claimed in claim 13, wherein the drain terminal of the current reference transistor is further connected to the leakage transistor.

* * * * *